US008064739B2

(12) United States Patent
Binkert et al.

(10) Patent No.: US 8,064,739 B2
(45) Date of Patent: Nov. 22, 2011

(54) THREE-DIMENSIONAL DIE STACKS WITH INTER-DEVICE AND INTRA-DEVICE OPTICAL INTERCONNECT

(75) Inventors: Nathan Binkert, Redwood City, CA (US); Norm Jouppi, Palo Alto, CA (US); Al Davis, Coalville, UT (US); Raymond Beausoleil, Redmond, WA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 728 days.

(21) Appl. No.: 11/977,350

(22) Filed: Oct. 23, 2007

(65) Prior Publication Data

US 2009/0103855 A1 Apr. 23, 2009

(51) Int. Cl.
*G02B 6/12* (2006.01)
*G11C 5/06* (2006.01)
(52) U.S. Cl. ............................................. 385/14; 365/64
(58) Field of Classification Search .................. 385/14
See application file for complete search history.

(56) References Cited

U.S. PATENT DOCUMENTS

| 5,652,811 | A | 7/1997 | Cook et al. |
| 6,477,286 | B1 | 11/2002 | Ouchi |
| 6,636,668 | B1 | 10/2003 | Al-hemyari |
| 6,885,099 | B2 | 4/2005 | Ogawa |
| 6,934,450 | B2 | 8/2005 | Hiramatsu |
| 7,138,295 | B2 | 11/2006 | Leedy |
| 7,177,171 | B2 | 2/2007 | Kasai |
| 7,327,600 | B2 | 2/2008 | Norman |
| 7,464,225 | B2 | 12/2008 | Tsern |
| 7,532,785 | B1 | 5/2009 | Beausoleil |
| 2002/0039464 | A1* | 4/2002 | Yoshimura et al. .............. 385/14 |
| 2003/0155656 | A1 | 8/2003 | Chiu |
| 2005/0023656 | A1 | 2/2005 | Leedy |
| 2006/0164882 | A1 | 7/2006 | Norman |
| 2007/0090507 | A1 | 4/2007 | Lin et al. |
| 2008/0151950 | A1 | 6/2008 | Lin |
| 2009/0103345 | A1 | 4/2009 | McLaren |

FOREIGN PATENT DOCUMENTS

WO 2006046801 5/2006

OTHER PUBLICATIONS

U.S. Appl. No. 11/975,974, Non-Final Rejection dated Sep. 15, 2008, pp. 1-10 and attachments.
U.S. Appl. No. 11/975,974, Notice of Allowance dated Mar. 31, 2009, pp. 1-5 and attachments.
U.S. Appl. No. 11/975,963, Non-Final Rejection dated Jun. 25, 2009, pp. 1-14 and attachments.
U.S. Appl. No. 11/975,963, Final Rejection dated Jan. 26, 2010, pp. 1-18 and attachments.

* cited by examiner

*Primary Examiner* — Uyen Chau N Le
*Assistant Examiner* — Kajli Prince (57) ABSTRACT

Examples of a computer system packaged in a three-dimensional stack of dies are described. The package includes an electrical die and an optical die coupled to and stacked with the electrical die. The electrical die includes circuitry to process and communicate electrical signals, and the optical die includes structures to transport optical signals. The electrical die has a smaller area than the optical die so that the optical die includes an exposed mezzanine which is configured with optical input/output ports. Additionally, the packaging can be configured to provide structural support against insertion forces for external optical connections.

22 Claims, 8 Drawing Sheets

Cross-Sectional Diagram for Stack

FIG. 1

Cross-Sectional Diagram for Stack

THREE-DIMENSIONAL DIE STACKS WITH INTER-DEVICE AND INTRA-DEVICE OPTICAL INTERCONNECT

BACKGROUND

Cross Reference to Related Applications

This patent application may contain subject matter related to the following patent applications, all of which are hereby incorporated by reference: (1) U.S. patent application Ser. No. 11/975,974, entitled "PHOTONIC INTERCONNECTS FOR COMPUTER SYSTEM DEVICES," filed Oct. 23, 2007, now U.S. Pat. No. 7,532,785; and (2) U.S. patent application Ser. No. 11/975,963, entitled "THREE-DIMENSIONAL MEMORY MODULE ARCHITECTURES" filed Oct. 23, 2007, U.S. Patent Publication No. 2009/0103345.

TECHNICAL FIELD

The present application relates generally to processors and memory for computer systems.

DESCRIPTION OF THE BACKGROUND ART

The growth of future silicon based computer systems is fundamentally limited by the inter-related problems of signal integrity, wire-based global signaling, and thermal properties. As integrated circuit process technology progressively shrinks transistor sizes, the wires that interconnect the transistors are increasingly becoming a limiting problem.

On chip wires may be classified based on their length: (i) local wires which are short and connect the transistors within a single execution unit, such as an adder; (ii) medium length wires which connect adjacent subsystems, such as register files and an execution unit; and (iii) global wires which connect distant subsystems, such as a cache controller and a register file.

Local wires scale with transistors and so are not as much of a problem. Medium wires benefit from proper repeater insertion and low-k dielectric materials.

However, global wires are a problem in high performance systems since, among other factors, they must be driven by large transistors. This consumes large amounts of power which in turn generate substantial heat. Given the density of transistors and the exponentially escalating leakage currents in advanced processors which increase with temperature, this becomes problematic.

The problems with global wires are exacerbated by the fact that the quality of the injected signal degrades with wire length. This degradation is due to capacitively-coupled noise issues. In essence, as a wire gets longer it becomes a better antenna. The capacitively-coupled noise issues may be fixed by shielding, but the shielding in turn impacts performance due to a reduction in cross-section bandwidth since the shield wires take up area on the device that could be used for signals which would increase bandwidth.

Off chip wires are also problematic in terms of power, signal integrity, energy per bit output bandwidth, and in terms of die area that needs to be allocated for pads.

Solutions for enabling computer systems to overcome these limitations of signal integrity, wire-based global signaling, and thermal properties.

SUMMARY

Computer systems packaged in a three-dimensional (3D) stack of dies are described in accordance with various embodiments of the present invention. In one embodiment, the computer system package includes an electrical die and an optical die coupled to and stacked with the electrical die. The electrical die includes circuitry to process and communicate electrical signals, and the optical die includes structures to transport optical signals. The electrical die has a smaller area than the optical die so that the optical die includes an exposed mezzanine which is configured with optical input/output ports. Additionally, the packaging can be configured to provide structural support against insertion forces for external optical connections.

DETAILED DESCRIPTION

The present application discloses embodiments of a three-dimensional die stack architecture and packaging techniques. The embodiments disclosed herein may be used to advantageously replace wire-based electronic signaling for the global interconnect with an optical interconnect.

Advantageously, optical signaling does not suffer from the above-discussed problems with electrical signaling. This is because the energy required to send a bit of information with optics is not dependent on the length of the photonic waveguide for the distances of interest. Furthermore, the energy per bit using optical interconnect scales with VLSI technology and is orders of magnitude less than using an electrical interconnect. This, therefore, substantially mitigates the thermal problem. In addition, optical signaling does not suffer from a length-dependent coupled noise problem and hence the signal integrity problem is not an issue for optical signals.

Another problem overcome by some embodiments of this invention is that silicon based lasers are of extremely poor quality. Some embodiments disclosed herein allow a multiplicity of externally supplied lasers (or attached lasers) capable of supplying sufficient optical power so as to provide adequate signaling power for on and off die-stack needs.

Another problem overcome by some embodiments of this invention relates to the mechanical integrity of through-die vias. Through-die vias typically require the wafers to be thinned such that fiber attachment insertion forces do not reliably maintain the physical integrity of the die structure. One or more embodiments disclosed herein allow optical fibers to be attached with mechanical integrity to the die stack to support off chip communication.

One embodiment of the present invention relates to a packaging method which incorporates a photonic die in a three-dimensional (3D) die stack with an exposed mezzanine. The exposed mezzanine allows either attached or external laser power injection and also exposes optical input/output (I/O) ports for external communication to other devices in the system. The die-stack employs through-die vias. Long-distance inter-die communication and intra-die communication may be carried on optical waveguides placed in an optical die that is configured in the 3D die stack.

Each attached or external laser may be configured to inject light into the optical die at a different frequency. Providing laser light at multiple frequencies enables wavelength division multiplexed communication within a single waveguide. This increases the effective bandwidth per cross sectional area. The optical I/O connections may be used to connect neighboring packages through optical fibers or to adjacent packages via fibers or free space waveguides.

One aspect of the present invention disclosed herein is the exposure of an optical mezzanine for the optical die. Optical fibers may be configured to connect to external optical bonding pads located on the optical mezzanine. The attached or external lasers may be configured to inject laser power into the photonic die via a separate interface located on the optical mezzanine. Optical fibers may be configured to go to the side of the package or directly to neighboring packages.

Figure 1:
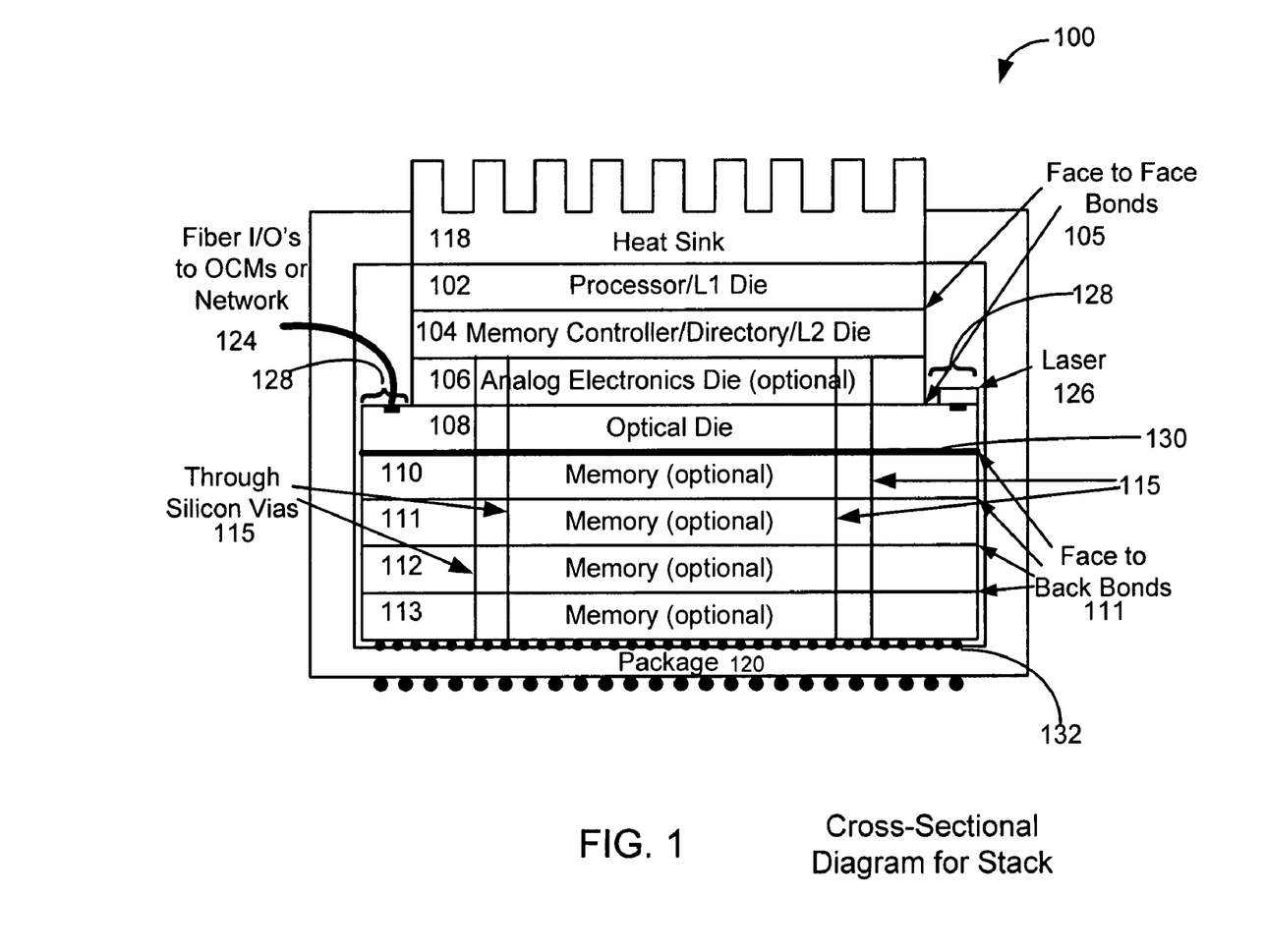
FIG. 1 is a cross-sectional view of a computer system device packaged in a 3D die stack including an optical die in accordance with an embodiment of the invention.

FIG. 1 is a cross-sectional view of a computer system device packaged in a 3D die stack employing a photonic interconnect on an optical die in the stack in accordance with an embodiment of the invention. The computer system device 100 comprises a processor die 102, a memory controller/directory/L2 die ("memory-controller die") 104, an optional analog electronic die 106, an optical die 108, and four exemplar stacked memory dies 110-113 stacked in a package 120. The stacked memory dies 110-113 can be volatile memory, such as dynamic random access memory ("DRAM"), non-volatile memory, or any combination of volatile and non-volatile memory. In particular, the stacked memory dies 110-113 can be 8 gigabyte ("GB") DRAM. The computer system device 100 also includes a heat sink 118 positioned on the package 120 near the processor die 102, and a number of vias, represented by four through vias 115, that extend from the memory-controller die 104 through the analog electronic die 106 and the optical die 108 to the four memory dies 110-113.

The dies 102, 104, 106, 108, and 110-113 can range in thickness from approximately 25 to approximately 50 microns. The heat sink 118 dissipates heat produced by computational operation of the processor die 102, and the through vias 115 can be metalized or silicon filled vias that electrically interconnect memory controllers in the memory die to each of the four memory dies 110-113. The memory controllers located within the memory-controller die 104 manage the flow of data going to and from the memory dies 110-113 and the flow of data going to and from external devices (not shown). The optical die 108 is larger that the other dies resulting in an exposed mezzanine 128 which can include external photonic input/output connections 124, 126 that can be used to couple light from an external light source such as a laser 126 or transmit data encoded optical signals through a waveguide such as an optical fiber 124 to and from the computer system device 100. A diamond layer 130 may also be included between the bottom surface of the optical die 108 and the top surface of the memory die 110-113. The diamond layer 130 can be approximately 1-10 µm thick and can be used to spread out and dissipate heat produced by the processor die 102 and the memory-controller die 104.

The three-dimensional die stacking shown in FIG. 1 permits tight coupling of the optical die 108 with the electronic dies, provides accessibility of the memory dies 110-113 at low latency, and, by spreading cluster logic and memory over stacked adjacent dies 102, and 104, the electrical intra-cluster wiring is shortened over conventional devices. In particular, stacking the memory dies in close proximity to the memory controllers and using vias running through the memory layers provides shorter-length, lower-resistance interconnections than the considerably longer, higher-resistance interconnections used to connect conventional memory to memory controllers. As a result, the power, or load, needed to transmit electrical signals between dies of the computer system device 100 is significantly lower than the power needed for conventional memory to memory controllers.

Due to thermal concerns and to facilitate cooling, the hottest die (the die generating the most heat during operation) may be stacked in a manner that it is the closest die nearest to a heat sink 118 or other cooling apparatus. The hottest die in a stack is typically the processor (processor/L1) die 102. While configurations with a processor die 102 attached very near or adjacent a heat sink 118 are illustrated, other configurations are also possible. Instead of, or in addition to, the heat sink 118, other cooling apparatus may be used. For example, a fan may be provided to actively blow air over the heat sink, or a thermoelectric cooler may be utilized. In other applications, a non-processor die may be configured to be adjacent to the cooling apparatus, or more than one cooling apparatus may be provided.

In the embodiment, a memory controller (memory controller/directory/L2) die 104 is configured beneath the processor die 102 by face-to-face bonding 105. In addition, this example illustrates an optional analog electronics die 106 which is configured beneath the memory controller die 104 by back-to-back bonding.

In this embodiment, the optical die 108 is configured beneath the analog electronics dies 106 by face-to-face bonding 105. For example, a silicon-germanium waveguide structure may be fabricated on the optical die 108. Here, the optical die 108 is intentionally fabricated to be larger than the analog electronics die 106 in either the horizontal and/or depth dimension in this figure. This size difference exposes optical mezzanine area or areas 128 (see FIG. 7, for an example top view).

The optical mezzanine areas are exposed planar areas 128 which may contain connection points for attached or external light sources such as non-silicon laser(s) and for the optical I/O (input/output) pads. In the illustrated embodiment, lasers 126 are directly attached to the mezzanine area 128 of the optical (photonic) die 108. In an alternate embodiment, in place of the attached lasers depicted, one or more optical waveguides 124 connected to one or more lasers external to the die stack may be attached to input laser ports on the optical mezzanine area(s). For example, one or more optical fibers 124 for input/output are attached to the optical I/O pads on the mezzanine area(s).

The lasers may be fabricated, for example, from a direct bandgap material, such as Indium-Phosphide (InP). In one implementation, the laser light may be split into multiple (for example, ten) wavelengths using a power divider. The wavelengths may be, for example, in the range of 1400 to 1500 nanometers (nm), and the modulation may be at approximately 10 gigahertz. In another implementation, one wavelength may be used and modulated at 100 gigahertz. Other specific implementations may use different wavelengths and modulation frequencies.

The external optical waveguides 124 and/or attached lasers 126 are preferably mechanically attached so as to maintain proper alignment. Mechanical strain relief features may be provided for the attached optical fibers. The mechanical strain relief features may be, for example, configured as part of the package 120 and/or near the point of interconnection to the optical die 108. In accordance with one embodiment, holographic lenses fabricated on top of the optical die 108 may provide a fiber to optical die interface.

In accordance with an embodiment of the invention, a robust structural foundation is provided in order to withstand the mechanical attachment insertion forces without breaking the thin and therefore fragile dies in the stack (particularly, the fragile optical die 108, but also the other stacked dies). This may be accomplished, for example, by supporting the optical die 108 with an equal (as shown in FIG. 1) or larger base die or dies. For example, the illustrated embodiment shows memory dies 110-113 as base dies which are configured beneath the optical die 108 by face-to-back bonding 111. Such memory dies 110-113 may be optional, depending on the implementation. In another embodiment, one or more additional optical dies (not illustrated) may be stacked as base die(s) under the optical die 108. The base die(s) is (are) in turn supported by a much stronger mechanical package 120. In this fashion there is a solid foundation backed by a rigid and robust package 120 which can withstand the mechanical insertion forces required to attach optical connectors such as optical fibers (124). For example, the package 120 may comprise a ball grid array 132 package.

Figure 2:
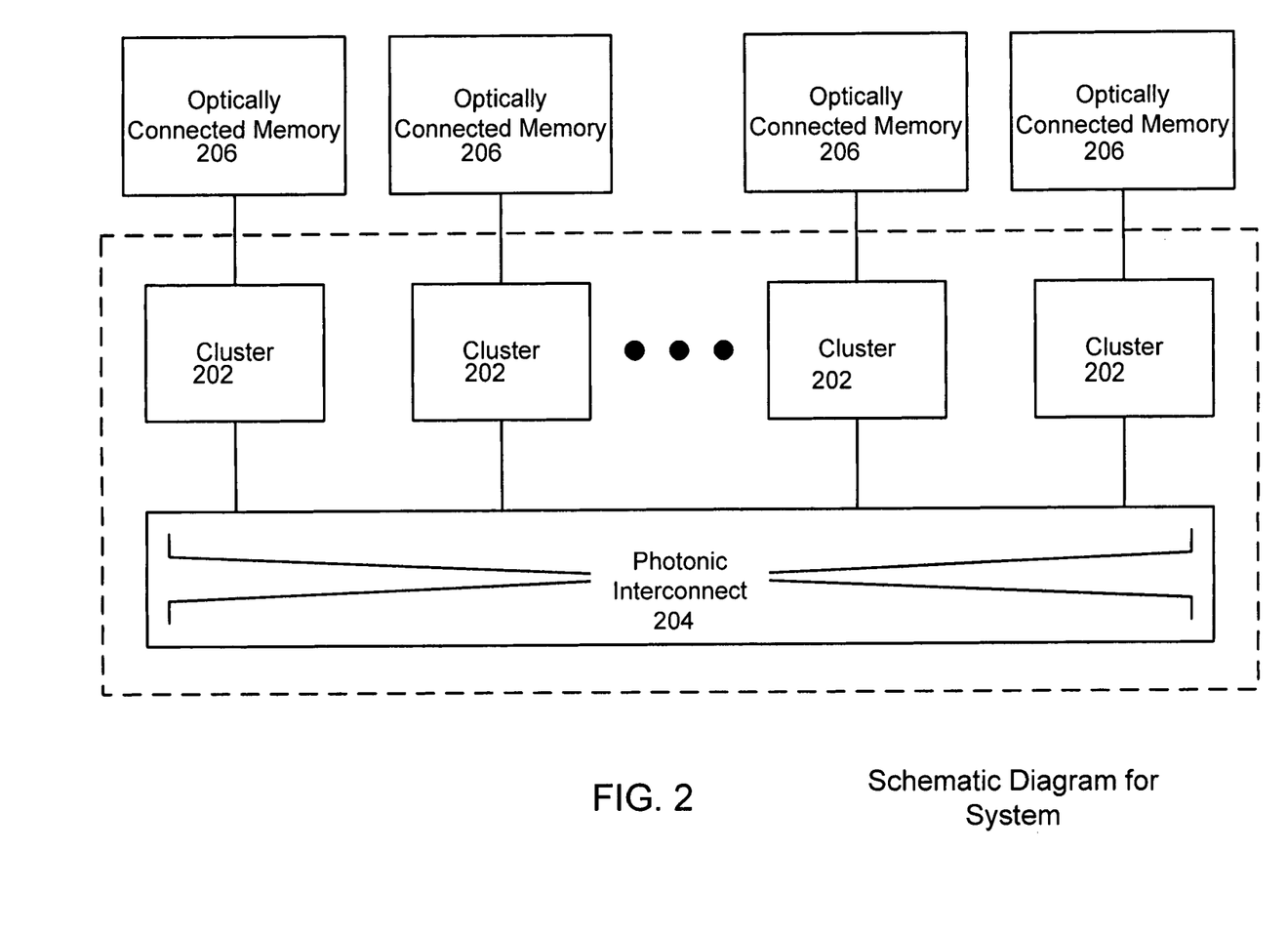
FIG. 2 is a schematic diagram of a multiple-cluster computer system in accordance with an embodiment of the invention.

FIG. 2 is a schematic diagram of a multiple-cluster computer system in accordance with an embodiment of the invention. Multiple computing clusters 202 are shown which are interconnected with an photonic interconnect 204. Each cluster 202 may also be connected to optically-connected memory 206.

The functionalities for the system components shown within the dashed line in FIG. 2 (i.e. the clusters 202 and the photonic interconnect 204) may be provided by the die stack shown in FIG. 1. For example, the functionalities for the clusters 202 may be provided by the Processor/L1 die 104 and the Memory Controller/Directory/L2 die 106. Meanwhile, the functionalities for the photonic interconnect 204 may be provided by the optical die 110. The optically-connected memories (OCMs) 206 may be external memory devices which are optically-connected to the stack by the fiber I/O's 124 shown in FIG. 1.

Each cluster of the processor die 102 has a corresponding memory controller disposed on the memory controller die 104, each memory controller interfaces to the stacked memory dies 110-113 or drives a photonic connection to off-chip memory to provide bandwidth that scales with the processor die 102 performance. The clusters are also photonically coupled to the optical die 108, offering high bandwidth, modest latency, and very low power consumption. Thus, a programmer with the stacked computational device 100 at his/her disposal can express parallelism at a high level, and is not burdened by issues of locality, which greatly reduces the difficulty of parallel program development. Furthermore, the computational device 100 architecture may provide bandwidth of one byte per flop to DRAM.

When 8 GB DRAM is selected for each of the memory dies 110-113, the on-stack memory provides 32 Gbytes of DRAM which is directly connected to the memory controllers through the multiple vias running through the DRAM, such as vias 120-123. The DRAM is provided by 4 memory stack layers, thinned to about 25 to 50 microns to minimize loading of, or the amount of power needed to use, the vias. Each layer of the DRAM stack includes 64 nearly identical regions which map onto the clusters in the processor die 102 above. Each DRAM region can be further subdivided into multiple banks that reduce the row access time, and allows multiple concurrent accesses. For example, using 20 nm DRAM technology each region may provide 1 Gbit of error correcting code protected storage, so that each memory controller in the memory-controller die 104 electronically connects to 0.5 Gbytes of memory. Multiple logical channels provide increased bandwidth into the memory. By providing increased bandwidth, bank conflicts in the DRAM are reduced. Each memory channel consists of 72 data bits and approximately 30 address and control bits. Using 25 micron pitch through vias the area overhead of the through vias may be less the 3% of the memory layer, assuming 4 channels per memory controller. Fine pitch through vias allow the DRAM to be structured to supply an entire cache line from a single row access. Additionally, the through-vias can be pitch matched with one or more elements in a layer of the stack. Some examples of such elements can be bit lines, sense amps and input/output buffers in a memory layer. When 512 GB DRAM is selected and arranged into 64 separate optically connected memory modules ("OCM"). The OCMs exploit the same basic technology as the 8 GB DRAM described above.

The optical die 108 performs two functions. First, the optical die 108 provides an interface to the optical fiber connections, such as external photonic interconnects 124 and 126. Second, the optical die 108 provides low power, global interconnect for the stack of DRAM. The OCMs and the processor are connected through optical fibers 124, which provides for as much as 48 logical channels that can be used for commands or other application-specific data exchanges.

Figure 3:
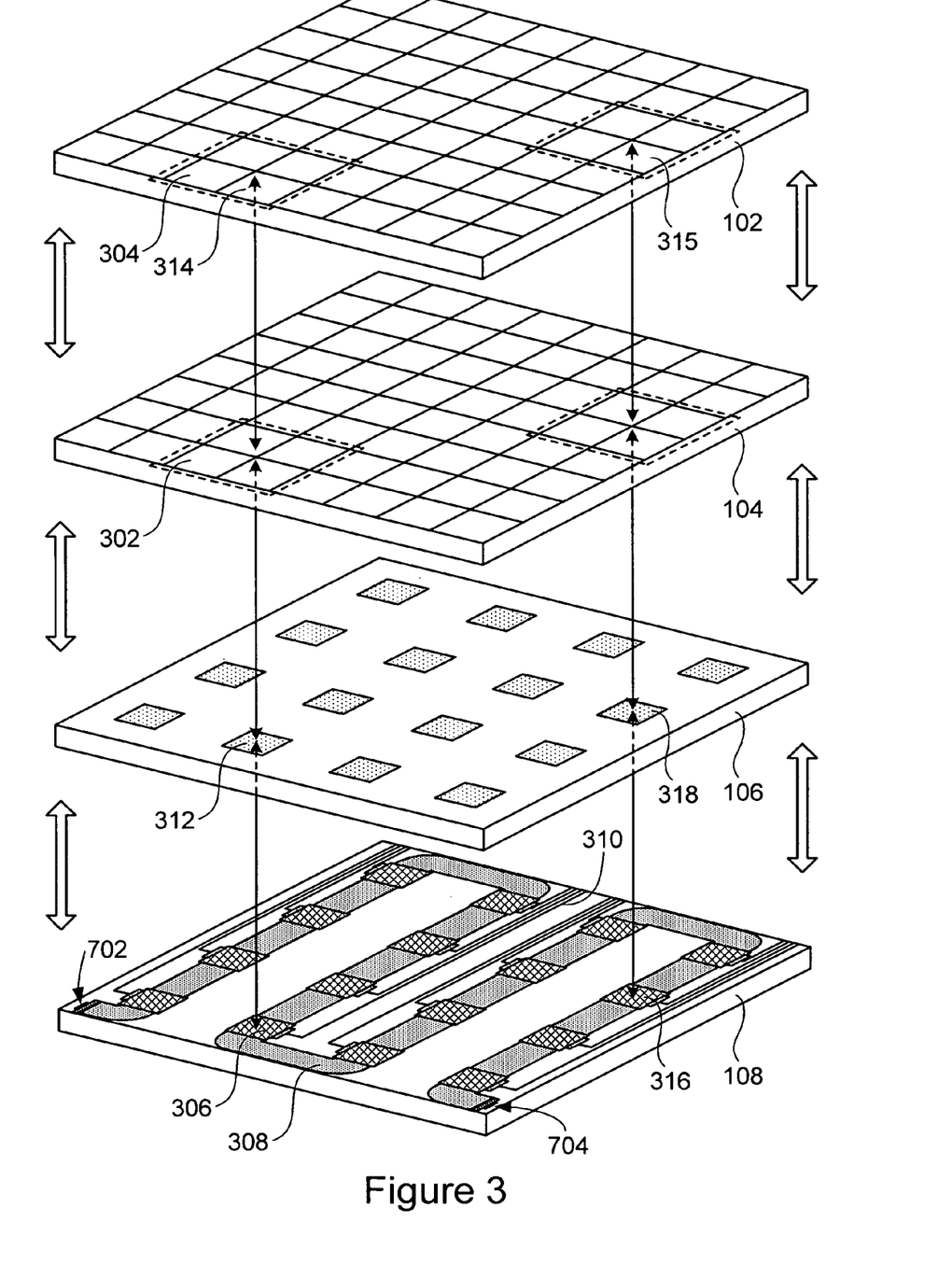
FIG. 3 shows an exploded isometric view of four die layers of the computer system device, shown in FIG. 1 in accordance with an embodiment of the invention.

FIG. 3 shows an exploded isometric view of the processor die 102, the memory-controller die 104, the analog electronic die 106, and the optical die 108 in accordance with embodiments of the present invention. As shown in FIG. 3, the processor die 102 and the memory-controller die 104 are partitioned into 64 tiles. In this example, each tile in the processor die 102 represents four cores called "clusters," and each tile in the memory-controller die 104 represents an L2 cache, a hub, a memory controller, and other devices that are in electronic communication with a corresponding cluster located approximately directly above in the processor die 102. For example, tile 302 of memory-controller die 104 represents an L2 cache, a hub, a memory controller and other devices located beneath and in electronic communication with an associated cluster 304. The clusters and tiles can be approximately 3 mm by 3 mm, but can be made larger or smaller depending on the implementation. Embodiments of the present invention are not limited to clusters having four cores. In other embodiments, a cluster can be comprised of two, three, and four or more cores. An example of a cluster and tile are described below with reference to FIGS. 4A-4B.

The optical die 108 includes 16 approximately regularly spaced optoelectronic converters, such as optoelectronic converter 306, approximately parallel (non-crossing) waveguides having a serpentine configuration, represented by strip 308, that wind their way through each of the 16 regularly spaced optoelectronic converters, and 16 bundles of 8 approximately parallel waveguides, each bundle emanating from a corresponding optoelectronic converter, such as bundle 310 emanating from the optoelectronic converter 306. The serpentine waveguides are called "on-chip waveguides" that provide photonic communication between optoelectronic converters, and the waveguides comprising the 16 bundles of waveguides are called "off-chip waveguides" that provide photonic communication via external photonic connections such as optical fiber 124 with devices located outside the computational device 100. The 16 optoelectronic converters are each comprised of four optoelectronic converter blocks (see FIG. 6). Each of the optoelectronic converter blocks ("converter blocks") is in electronic communication with one of the four associated tiles in the memory-controller die 104. FIG. 3 also reveals two, substantially identical, channel sources 702 and 704 positioned at opposite ends of the serpentine on-chip waveguides 308. The sources 702 and 704 are each configured to output the same set of different channels onto each of the on-chip waveguides in opposite directions. A directional arrow represents the direction channels output from the source 702 are transmitted, and a directional arrow represents the direction channels output from the source 704 are transmitted. The serpentine on-chip waveguides 308 have a width of approximately 1900 microns. These light sources can be on-chip or can be external light sources 126. External light sources can be made of different materials than silicon such as III-V materials which are more suitable for lasers.

Note that the communication of optical signals within the devices in the die stack may be considered as intra-device communications, and that the communication of optical signals with devices external to the die stack may be considered as inter-device communications. Hence, the waveguide structure of FIG. 3 provides both inter-device and intra-device optical interconnect.

The analog electronic die 106 includes 16 patches, each patch is located between four tiles in the memory-controller die 104 and an optoelectronic converter in the optical die 108. Each patch comprises a number of metalized or silicon filled through vias that provide for analog electronic communication between the four tiles in the memory-controller die 104 and the corresponding optoelectronic converters. Data is transmitted through the patches in the form of electronic analog signals ("electrical signals") because producing analog signals typically consumes considerably less power than producing digital electrical signals. Such an analog layer can be used to convert digital signals from the memory controller to analog signals needed to control modulators or other devices on the optical layer, to convert analog outputs of photodetectors to digital signals to be input to the memory controller, or for other uses.

The following description is an overview of how an example of a photonic interconnect on an optical die 108 can take advantage of external photonic connections supported by the mezzanine 128 for transmitting data between clusters and external devices. Data generated by a bluster of the processor die 102, such as cluster 304, or extracted from a tile of the memory-controller die 104, such as tile 302, is transmitted as data encoded electrical signals through vias in a patch 312 to a corresponding converter block (not shown) of the optoelectronic converter 306. The converter block encodes the electrical signals into one or more wavelengths of electromagnetic radiation, called "channels," propagating in one or more of the on-chip waveguides 308. Encoding data into unmodulated channels can be accomplished by modulating the intensity of the channels. Channels carrying data are referred to as "encoded channels."

The encoded channels can be destined for (1) a neighboring cluster 314, which is also in electronic communication with the same optoelectronic converter 306, (2) a cluster located elsewhere in the processor die 102 such as cluster 315, or (3) an external device (not shown). When the encoded channels are destined for the neighboring cluster 314, its corresponding converter block located within the optoelectronic converter 306 receives the encoded channels and converts them back into encoded electrical signals that are transmitted back through the patch 312 to the cluster 314. When the data encoded channels are destined for the cluster 315, the encoded channels are transmitted along appropriate on-chip waveguides to a converter block corresponding to the cluster 315 located with an optoelectronic converter 316. The encoded channels are converted back into encoded electrical signals that are transmitted through a patch 318 to the cluster 315.

When the encoded channels are destined for an external device, the converter block of the optoelectronic converter 306 places the encoded channels onto off-chip waveguides of the bundle 310 where the encoded channels exit the optical die 108 through an external photonic connector such as optical fiber 124. When an external device generates encoded channels destined for one of the four clusters 314, the encoded channels can be received via optical fiber 124 and be transmitted along the off-chip waveguides in the bundle 310 to the optoelectronic converter 306 where the encoded channels are converted into encoded electrical signals that are transmitted through the patch 312 to the four clusters 314 for processing.

Clusters and Memory Controllers

Figure 4A:
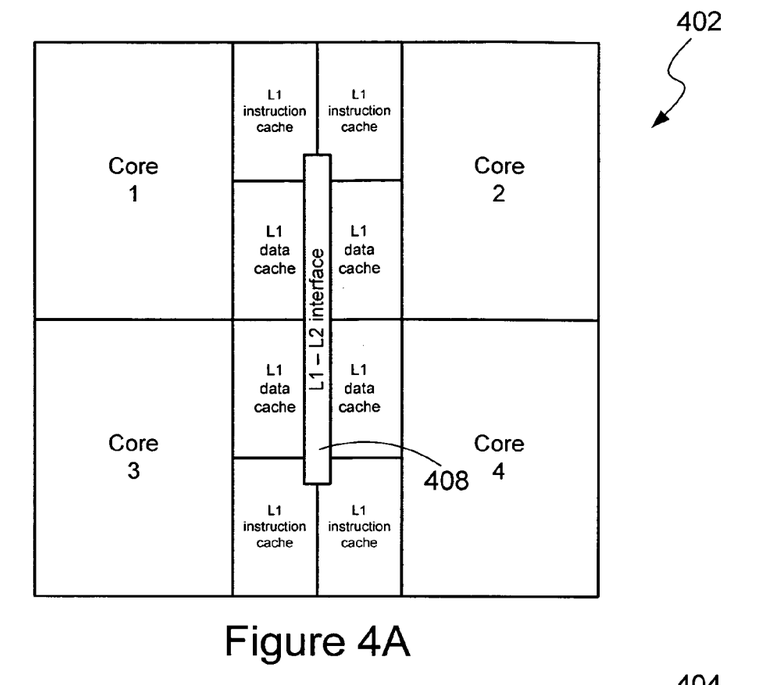
FIG. 4A provides an example processor die layout showing circuitry associated with a single cluster in accordance with an embodiment of the invention.

FIG. 4A shows a cluster 402 of the processor die 102 in accordance with embodiments of the present invention. The cluster 402 comprises four cores. Each core is in electrical communication with an L1 instruction cache and an L1 data cache. An L1 instruction cache and an L1 data cache are high speed random access memory that temporarily store frequently or recently accessed instructions and data.

Figure 4B:
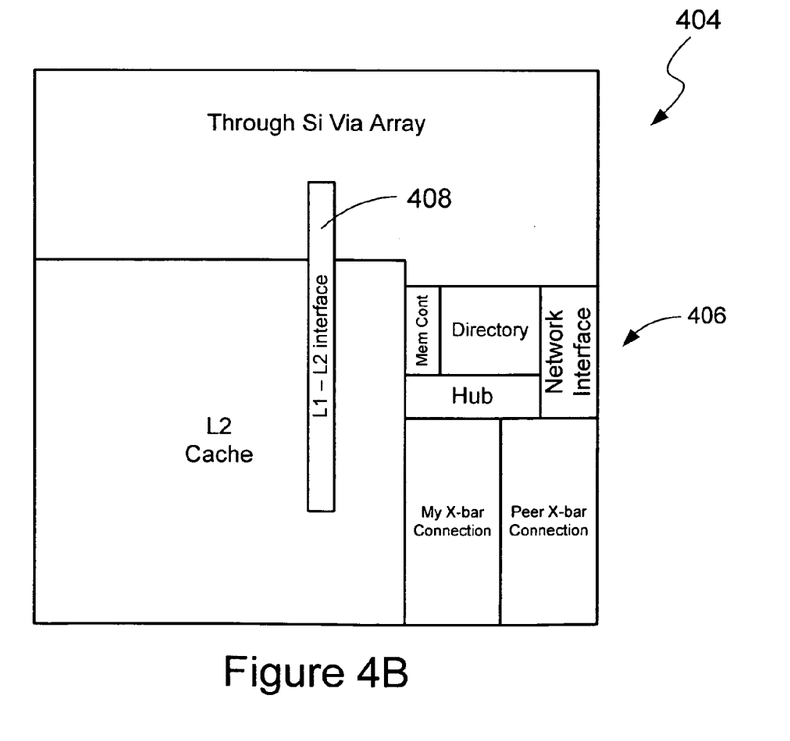
FIG. 4B shows a tile of a memory controller die in accordance with an embodiment of the invention.

FIG. 4B shows a tile 404 of the memory-controller die 104 in accordance with embodiments of the present invention. The tile 404 includes an L2 cache and a component region 406 comprising a hub, a memory controller, directory, network interface, a my crossbar connection, and a peer crossbar connection. These crossbar connections may be configured to interface with corresponding portions of the optoelectronic converters. The L2 cache is shared by the four cores of the cluster 402. An L1-L2 interface 408 is positioned in approximately the center of the cluster 402 and the tile 404 and provides electronic communication between the cluster 402 and the tile 404.

Figure 5:
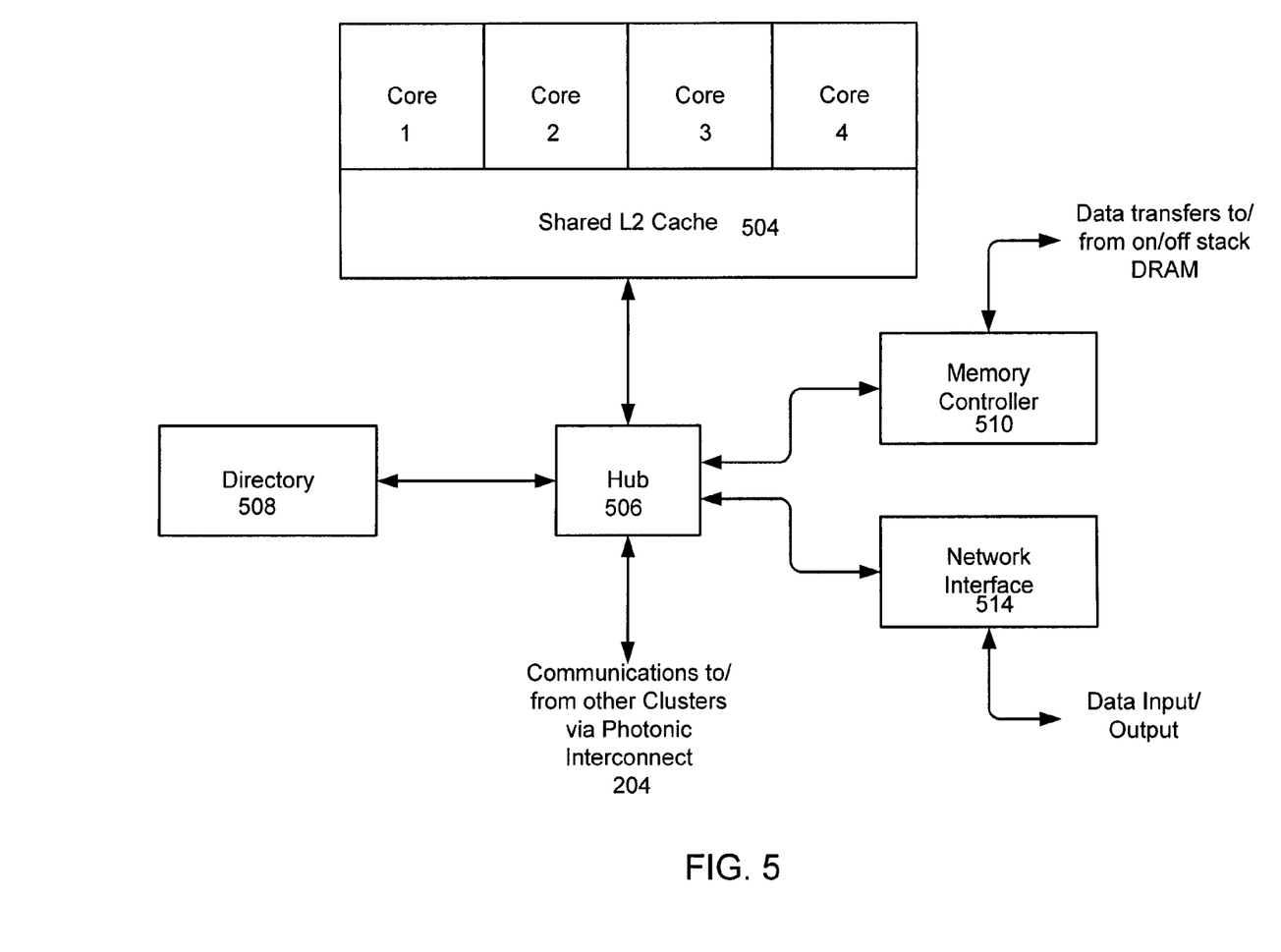
FIG. 5 is a schematic diagram of circuitry for a single computing cluster in accordance with an embodiment of the invention.

FIG. 5 is a schematic diagram of circuitry for a single computing cluster in accordance with an embodiment of the present invention. In this embodiment, multiple processor cores 1-4 are shown, each of which includes an associated level 1 (L1) cache. These processor cores (and associated L1 caches) can be provided on processor/L1 die 102.

A shared level 2 (L2) cache 504 interconnects with each of the cores 1-4. The L2 cache 504 interfaces with a hub interconnect 506. The hub interconnect 506 further interfaces with various components, such as a directory module 508, a memory controller 510, a network interface 514, and the photonic interconnect 204. The directory module 508 may be configured to provide cache coherency, for example, by tracking a global state of memory on a per cache line basis. The memory controller 510 may transfer data to and from main memory (e.g. DRAM). The DRAM may be on-stack DRAM 110-113 shown in FIG. 1 or may be off-stack DRAM, such as optically-connected memories (OCMs) interconnected by way of the fiber input/outputs 124. The network interface 514 may provide data input/output to components outside of the stack, for example by way of the fiber input/output to components outside of the stack, for example by way of the fiber input/outputs 124.

Figure 6:
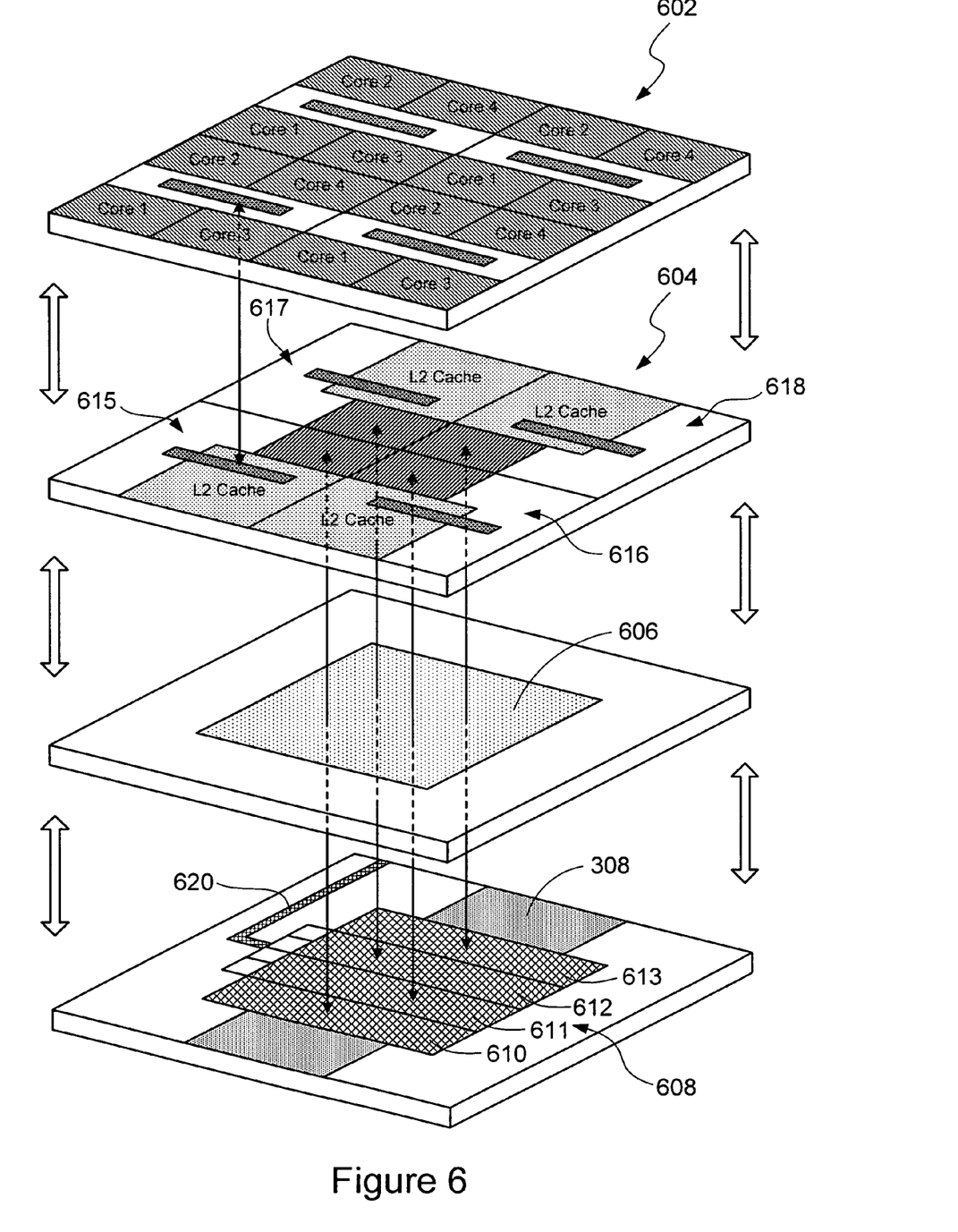
FIG. 6 shows an enlarged, exploded isometric view of the four die layers of the computation device, shown in FIG. 1, in accordance with an embodiment of the invention.

FIG. 6 shows an enlarged, exploded isometric view of four clusters 602 of the processor die 102, four corresponding tiles 604 of the memory-controller die 104, a patch 606 of the analog electronic die 106, and an optoelectronic converter 608 of the optical die 108 arranged in accordance with embodiments of the present invention. As shown in FIG. 6, the optoelectronic converter 608 comprises four individual optoelectronic converter blocks 610-613. Each converter block is in electronic communication with one of the four tiles 604 via the patch 606. In particular, tile 615 is in electronic communication with the converter block 610, tile 616 is in electronic communication with the converter block 611, tile 617 is in electronic communication with the converter block 612, and tile 618 is in electronic communication with the converter block 613. The converter blocks 610-613 convert encoded electrical signals output from the tiles 615-618, respectively, into encoded channels that can be transmitted on a portion of the on-chip waveguides 308 for processing by other clusters or transmitted on a bundle of waveguides 620 to external devices for processing. The converter blocks 610-613 also convert encoded channels transmitted in the bundle 620 and the on-chip waveguides 308 into encoded electrical signals that can be processed separately by the four clusters 602.

Figure 7:
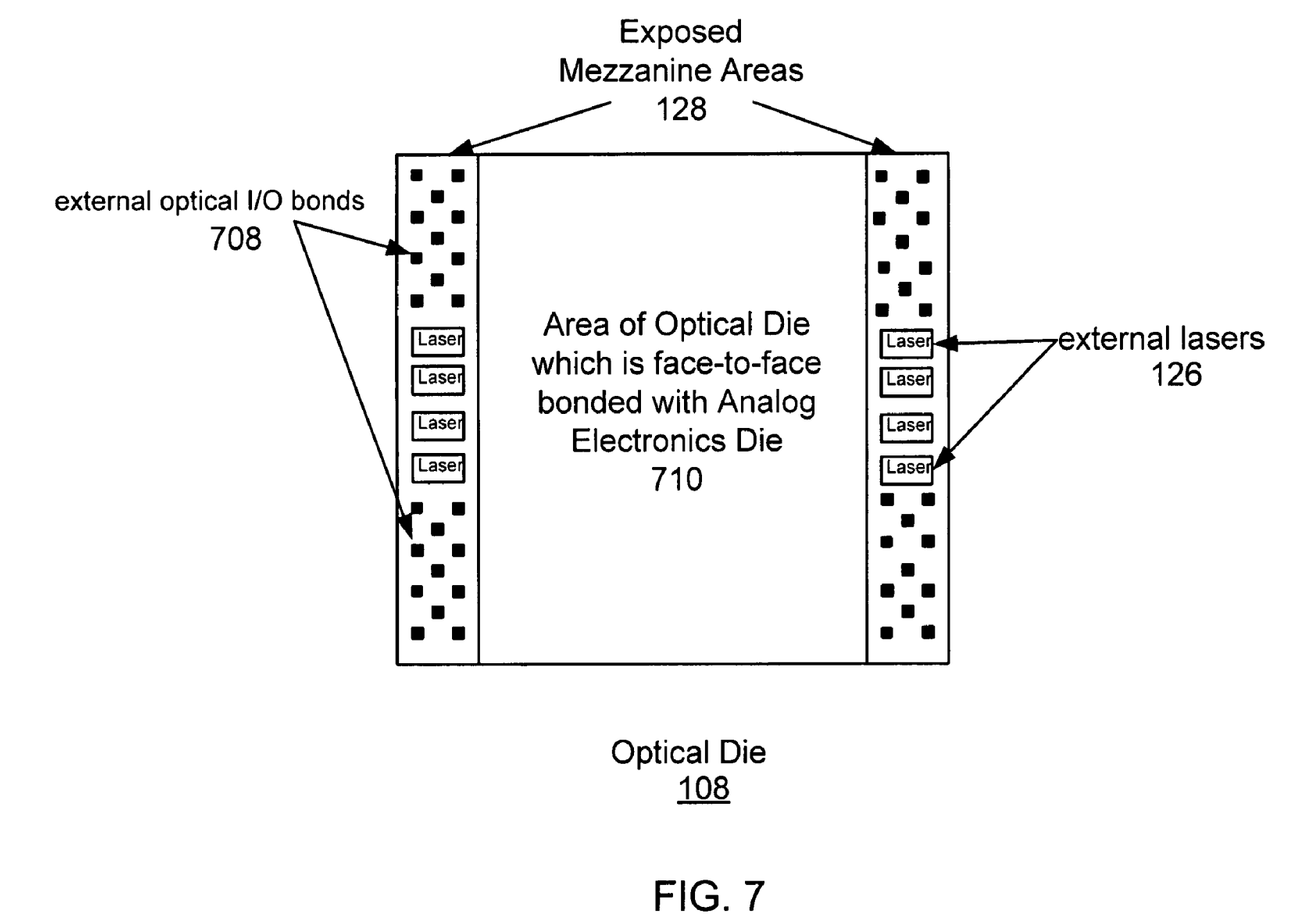
FIG. 7 is a top view of an optical die which shows a two-sided optical mezzanine in accordance with an embodiment of the invention.

FIG. 7 is a top view of an optical die which shows a two-sided optical mezzanine in accordance with an embodiment of the invention. As shown in the figure, a center portion 710 of a front side of the optical die 108 is face-to-face bonded with the analog electronics die 106. The exposed mezzanine regions or areas 128 may be on either side of the center portion 710, as in FIG. 1. In a different embodiment, the exposed mezzanine regions or areas may be on all four sides of the center portion.

As shown in FIG. 7, lasers 126 external to the optical die 108 may be attached to either or both mezzanine areas 128. In other embodiments, instead of the attached lasers, optical fibers connected to lasers external to the die stack may be attached to input laser ports on the optical mezzanine 128. Optical fibers 124 for input/output may be coupled to the external optical I/O bonds 708 on the optical die 108.

Figure 8:
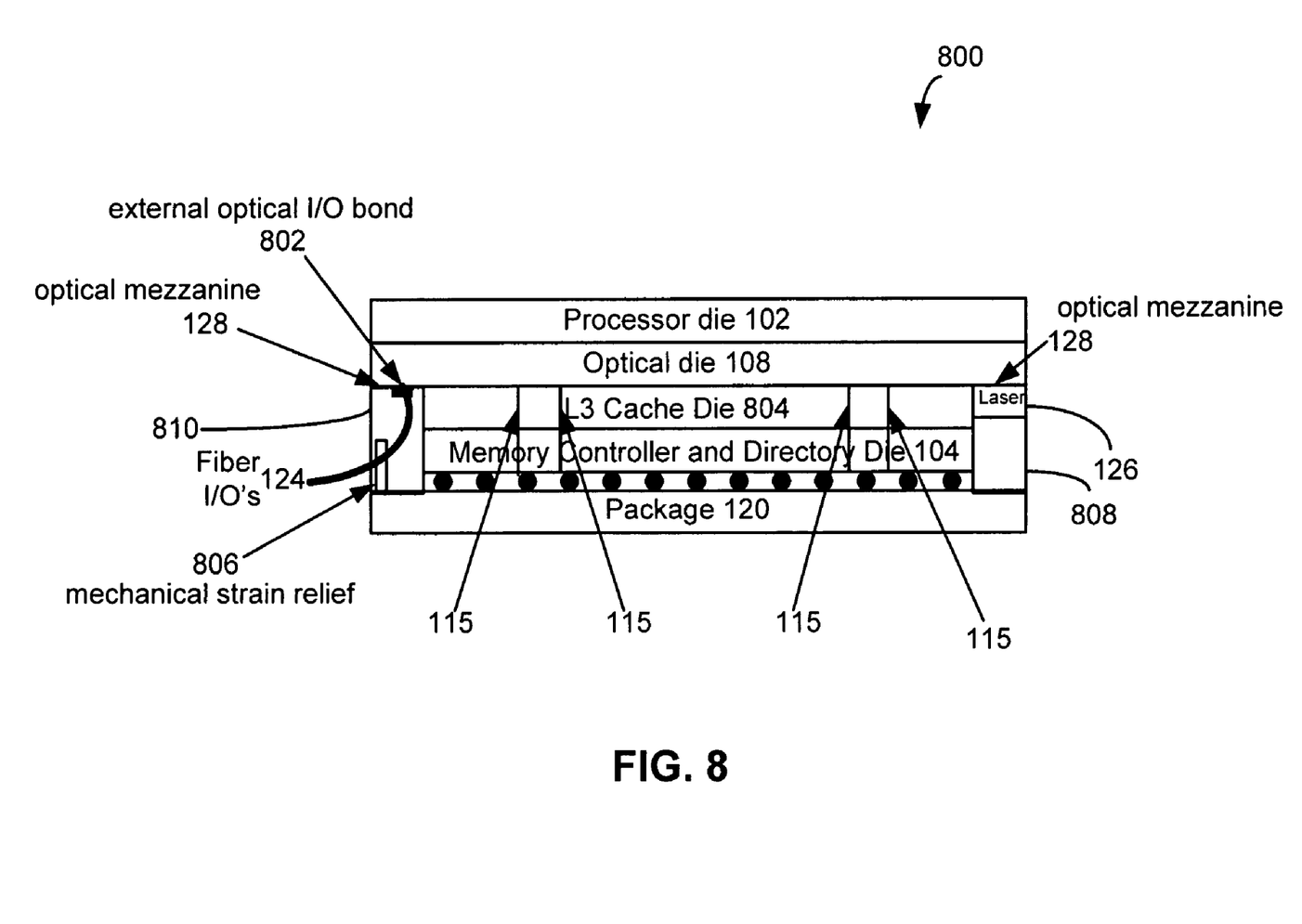
FIG. 8 is a cross-sectional view of a computer system device packaged in a 3D die stack including an optical die in accordance with another embodiment of the present invention.

FIG. 8 is a cross-sectional view of a computer system device packaged in a 3D die stack 800 including an optical die in accordance with another embodiment of the present invention. This 3D die stack embodiment bonds the optical die 108 to the processor die in an arrangement where the optical mezzanine 128 is exposed on the bottom side of the optical die. The optical die 108 shares about the same area as the processor die 102 in this example and overhangs a memory die L3 Cache Die 804 and the memory controller die 104. Through vias 115 extend from the memory controller die 104 through the L3 Cache Die 804. The external input output bond 802 and the optical fiber 124 are supported by sidewall 810 which has an opening for the fiber 124 to pass through. An additional mechanical strain relief 806 can also be included to assist the sidewall in supporting the optical die 108 and above layers from underneath. The external laser 126 is supported by sidewall 808.

Various problems and difficulties are overcome by the above-disclosed architecture. First, the die material that is optimal for memory and processor/logic fabrication is very different from the material properties that are optimal to generate optical lasing. Today, silicon-based structures are used for memory and logic structures while integrated lasers are generally best fabricated using III-V materials, such as Indium Phosphide or Gallium Arsenide. These III-V materials may be used to make memory and logic structures that are very fast. However, the thermal properties of these III-V materials typically preclude their use in high performance complex computer systems.

Second, while die stacking allows each die to be made from the material which is well-matched to perform the die's intended function, the thermal problem remains. By exposing a mezzanine and using externally supplied laser power in accordance with embodiments of the invention, it becomes possible to have the advantages of optical communication without increasing the thermal density in the die stack. If thermal density is not a problem, then the attached laser embodiment may be preferred. The exposed mezzanine which is mechanically robust also provides the advantages of optical communication to adjacent and/or neighboring packages.

Third, a substantial problem in the development of high-performance computer chips, particularly for feature sizes below 250 nanometers, is that the long wire interconnects do not scale well when compared to the transistors. Specifically, the long wires present an obstacle in terms of signal integrity. This is because their capacitance requires too much current to charge quickly and so results in heat that cannot be economically removed. Long wires are also a barrier to high-speed operation. Fundamentally, the capacitance of a wire is a function of area and resistance is a function of the wire's width to length aspect ratio. The result is that the per bit transport energy and the propagation delay of the wire increase with wire length. Optical communication is relatively independent of path length for the scales of interest. Therefore, employing optical interconnect reduces the power needed and the heat generated, as well as improving the performance of computer systems when compared with systems which support long distance communication electrically. Signal integrity in electrical interconnects also degrades with length. Photonic interconnects do not suffer from this length dependent problem.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus comprising a three-dimensional stack of dies, the apparatus comprising:
   a processor die having a plurality of processor cores;
   an electrical die comprising a cache memory and a memory controller;

an optical die coupled to the electrical die, said optical die comprising structures to transport and modulate optical signals, wherein the processor die, electrical die, and optical die are stacked one over another to form the three-dimensional stack; and an exposed optical mezzanine of the optical die which is configured with optical input/output ports.

2. The apparatus of claim 1, further comprising:
a cooling device attached to said processor die; and
packaging configured to provide structural support against insertion forces when optical fibers are interconnected to the optical input/output ports on the optical die.

3. The apparatus of claim 1, wherein the electrical die has a smaller area than the optical die, and wherein the optical input/output ports of the exposed optical mezzanine are externally accessible when the processor die, electrical die, and optical die are stacked together.

4. The apparatus of claim 1, further comprising:
one or more base dies coupled to and stacked with the optical die on a first side of the optical die opposite of a second side of the optical die that faces said electrical die, wherein said base die(s) comprise electrical and/or optical dies.

5. The apparatus of claim 4, wherein the one or more base dies include at least one memory die having a memory device, wherein the memory controller is electrically connected to the memory device through electrical vias that pass through the optical die.

6. The apparatus of claim 4, wherein the one or more base dies each has a smaller area than the optical die such that the exposed optical mezzanine is on a side of the optical die facing the one or more base dies.

7. The apparatus of claim 1, further comprising:
a sidewall structure to form a cavity into which said processor die, electrical die, and optical die are positioned.

8. The apparatus of claim 1, further comprising electrical vias configured to go through at least the optical die.

9. The apparatus of claim 1, wherein the exposed optical mezzanine further includes at least one input for receiving laser input from an external laser.

10. The apparatus of claim 9, wherein the external laser is attached to the exposed optical mezzanine.

11. The apparatus of claim 9, wherein the external laser is coupled to the exposed optical mezzanine by way of an optical fiber.

12. The apparatus of claim 1, further comprising:
a diamond layer for heat dissipation provided between the optical die and the electrical die.

13. The apparatus of claim 1, wherein the optical die has at least one optoelectronic converter to receive an electrical signal from the electrical die and to convert the electrical signal to an optical signal,
wherein the optoelectronic converter is configured to route the optical signal to a first waveguide if the optical signal is destined to one of the processor cores on the processor die, and
wherein the optoelectronic converter is configured to route the optical signal to a second waveguide to pass the optical signal to one of the optical input/output ports on the exposed optical mezzanine to direct the optical signal to an external device outside the three-dimensional stack of dies, if the optical signal is destined to the external device.

14. A method for forming a three-dimensional stack of dies, the method comprising:

arranging a processor die with an electrical die in the stack, wherein the processor die has a plurality of processor cores;
bonding the electrical die comprising a cache memory and memory controller to an optical die in the stack, wherein the optical die comprises structures to transport and modulate optical signals; and
exposing a mezzanine area on the optical die having optical input/output ports when the processor die, electrical die, and optical die are stacked together in the stack.

15. The method of claim 14, wherein the optical die has at least optoelectronic converter to receive an electrical signal from the electrical die and to convert the electrical signal to an optical signal, the method further comprising:
arranging the optoelectronic converter to:
route the optical signal to a first waveguide if the optical signal is destined to one of the processor cores on the processor die, and
route the optical signal to a second waveguide to pass the optical signal to one of the optical input/output ports on the exposed mezzanine area to direct the optical signal to an external device outside the three-dimensional stack of dies, if the optical signal is destined to the external device.

16. An apparatus having a three-dimensional stack of semiconductor dies comprising:
a processor die having a plurality of processor cores;
a memory controller die having a memory controller, a cache memory, and a network interface;
an electrical die comprising at least analog electronics circuitry; and
an optical die comprising structures to transport and modulate optical signals and coupled to the electrical die by way of a face-to-face bond, wherein the memory controller die is to communicate with the optical die through the electrical die; and
a mezzanine area on the optical die which is exposed with input/output ports for receiving and sending the optical signals.

17. The apparatus of claim 16, further comprising:
a cooling device attached to the processor die.

18. The apparatus of claim 16, further comprising at least one memory die in the stack and electrical through-vias interconnecting the at least one memory die to said memory controller, wherein the at least one memory die has a memory device.

19. The apparatus of claim 16, further comprising:
at least one additional optical die in the stack.

20. The apparatus of claim 16, further comprising:
a diamond layer for heat dissipation provided between the optical die and the electrical die.

21. An apparatus comprising a three-dimensional stack of dies, the apparatus comprising:
a processor die having a plurality of processor cores;
an electrical die comprising a cache memory and a memory controller;
an optical die coupled to the electrical die, said optical die comprising structures to transport and modulate optical signals, wherein the processor die, electrical die, and optical die are stacked one over another to form the three-dimensional stack; and
an exposed optical mezzanine of the optical die which is configured with optical input/output ports,
wherein the optical die has at least one optoelectronic converter to receive an electrical signal from the electrical die and to convert the electrical signal to an optical signal, wherein the optoelectronic converter is configured to route the optical signal to a first waveguide if the optical signal is destined to one of the processor cores on the processor die, wherein the optoelectronic converter is configured to route the optical signal to a second waveguide to pass the optical signal to one of the optical input/output ports on the exposed optical mezzanine to direct the optical signal to an external device outside the three-dimensional stack of dies, if the optical signal is destined to the external device, and wherein the processor cores are divided into plural clusters, wherein the electrical die has plural tiles, each tile having a respective memory controller and cache memory for a respective one of the plural clusters of processor cores, and wherein the optical die has plural optoelectronic converters corresponding to the plural tiles.

22. A method for forming a three-dimensional stack of dies, the method comprising:

arranging a processor die with an electrical die in the stack, wherein the processor die has a plurality of processor cores;

bonding the electrical die comprising a cache memory and memory controller to an optical die in the stack, wherein the optical die comprises structures to transport and modulate optical signals; and exposing a mezzanine area on the optical die having optical input/output ports when the processor die, electrical die, and optical die are stacked together in the stack, wherein the optical die has at least optoelectronic converter to receive an electrical signal from the electrical die and to convert the electrical signal to an optical signal;

arranging the optoelectronic converter to:
  route the optical signal to a first waveguide if the optical signal is destined to one of the processor cores on the processor die, and
  route the optical signal to a second waveguide to pass the optical signal to one of the optical input/output ports on the exposed mezzanine area to direct the optical signal to an external device outside the three-dimensional stack of dies, if the optical signal is destined to the external device;

dividing the processor cores on the processor die into plural clusters;

providing plural tiles on the electrical die, wherein each tile has a respective memory controller and cache memory for a respective one of the plural clusters of processor cores; and providing, on the optical die, plural optoelectronic converters corresponding to the plural tiles.

* * * * *